Aug. 21, 1962 R. L. BRASS 3,050,698

SEMICONDUCTOR HALL EFFECT DEVICES

Filed Feb. 12, 1960 2 Sheets-Sheet 1

INVENTOR
R. L. BRASS
BY R. O. Nimz
ATTORNEY

Aug. 21, 1962 R. L. BRASS 3,050,698

SEMICONDUCTOR HALL EFFECT DEVICES

Filed Feb. 12, 1960 2 Sheets-Sheet 2

INVENTOR
R. L. BRASS
BY R. O. Nimz
ATTORNEY 3,050,698
Patented Aug. 21, 1962

3,050,698

SEMICONDUCTOR HALL EFFECT DEVICES

Robert L. Brass, Morristown, N.J., assignor to Bell Telephone Laboratories, Incorporated, New York, N.Y., a corporation of New York Filed Feb. 12, 1960, Ser. No. 8,313
16 Claims. (Cl. 332—51)

This invention relates to semiconductor signal translating devices and, more particularly, to semiconductor devices utilizing the so-called Hall effect.

Hall effect devices are well known in which current flowing through a conductor is deflected by a magnetic field at right angles to both the direction of current flow and the direction of the applied magnetic field. This deflection results in an accumulation of charge at one side of the conductor and thereby establishes a potential gradient laterally across the conductor. This voltage, known as the Hall voltage, is a function of the strength of the applied field as well as the current magnitude.

Many devices taking advantage of the Hall effect have been proposed, including field and current detectors, modulators and a variety of nonreciprocal or antireciprocal transducers such as gyrators, isolators and circulators. One major drawback of all of the heretofore proposed devices has been the high transmission loss inherent in the mechanics of the Hall effect. Furthermore, properties which directly affect the Hall effect, for example, current carrier mobility and permeability of the field-producing core, are usually very sensitive to temperature, thus making it difficult to fabricate Hall effect devices with temperature stability.

It is a principal object of the present invention to improve the characteristics of Hall effect devices sufficiently to provide practical and useful circuit components.

It is another object of the invention to improve the stability of the operation of Hall effect devices with temperature and other ambient conditions.

It is a more specific object of the invention to provide Hall effect devices having zero transmission loss or even a transmission gain.

A related object is to provide integral Hall effect-amplifier structures combining the advantages of the Hall effect with useful amplifier action.

The most useful Hall effect materials to date have been semiconductors which combine reasonable carrier mobility with as high an energy gap as possible. In accordance with the present invention, the semiconductor slab in which the Hall effect phenomena take place is fabricated as one electrode of a junction transistor in such a manner as to add the normal transistor action to the Hall effect. In this way, many additional properties can be built into the device in addition to the Hall effect, such as, for example, amplification, easily controllable input and output impedance levels and stable characteristics.

More particularly, a device of this type in which the Hall effect slab forms the emitter electrode of each of at least two substantially identical junction transistors will preserve an internal balance of fluctuations resulting from variations in temperature and other ambient conditions. The gain of the device can therefore be applied to transfer extremely low level Hall voltages into useful outputs.

These and other objects and features, the nature of the present invention and its various advantages, will be more readily understood upon consideration of the attached drawing and of the following detailed description of the drawing.

Figure 1:
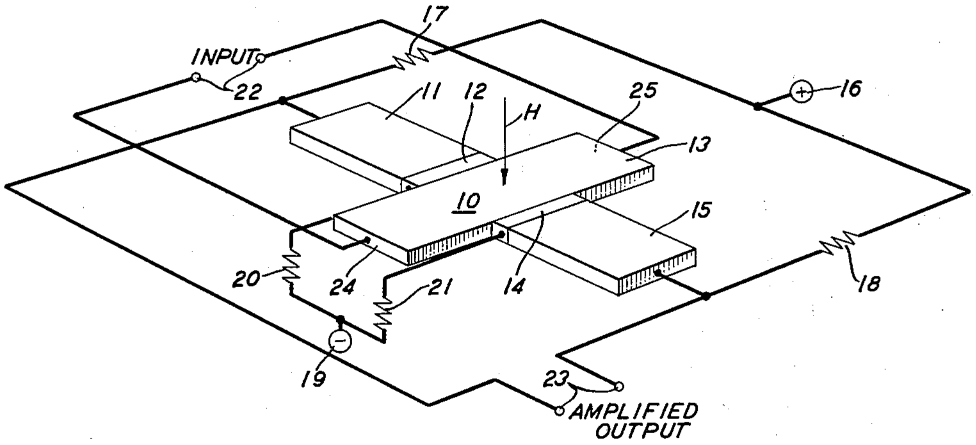
FIG. 1 is a perspective view of a Hall effect differential amplifier in accordance with the present invention.

Referring more particularly to FIG. 1, there is shown a semiconductor structure 10 comprising five regions 11, 12, 13, 14, and 15 separated by defined boundaries. Regions 11 through 15 are fabricated such that alternate regions are composed of semiconductor material of the same conductivity type while adjacent regions are composed of semiconductor materials of opposite conductivity type, that is, regions 11, 13, and 15 may comprise, for example, p-type semiconductor material while regions 12 and 14 comprise n-type semiconductor material. Alternatively, each of these regions may be composed of semiconductor material of the opposite conductivity type, that is, 11, 13 and 15 of n-type material and 12 and 14 p-type material.

Between adjacent regions of opposite conductivity type there are formed semiconductor junctions similar to the junctions formed in conventional junction transistor structures. Regions 11 and 15 are biased from a direct-current voltage source 16 through resistors 17 and 18, respectively. Similarly, regions 12 and 14 are biased from direct-current voltage source 19 through resistors 20 and 21, respectively. A magnetic field represented in FIG. 1 by the arrow H is applied to the central region 13 of the device 10 in a direction from the top to the bottom of the figure by means of a magnetic structure not illustrated. This structure may, for example, comprise a permanently magnetized core having pole pieces closely adjacent the top and bottom surfaces of central region 13. Alternatively, the magnetic core material may be magnetized from a direct-current source by means of a coil wound around the magnetic material. In either case, a magnetic field H of substantially uniform strength is established in one direction through central region 13.

At two diametrically opposed edges of central region 13 are located low resistance contacts connected to input terminals 22. Similar low resistance contacts on the free extremities of outer regions 11 and 15 are connected to output terminals 23. The polarity and magnitudes of bias voltage sources 16 and 19 are chosen so as to forward bias the junctions between central slab 13 and adjacent regions 12 and 14, respectively, and to reverse bias the junctions between regions 11 and 12 and the junction between regions 14 and 15. Thus, if regions 11 and 15 comprise n-type semiconductor material voltage, source 16 will have a polarity which is positive with respect to the polarity of voltage source 19, as shown in FIG. 1. On the other hand, if regions 11 and 15 are of p-type material, voltage source 16 will have a polarity which is negative with respect to the polarity of voltage source 19.

Central region 13 is composed of semiconductor material which exhibits a substantial Hall effect. That is, region 13 is composed of material providing a good compromise between high carrier mobility and a high energy gap. While germanium is suitable for this purpose, other semiconductor materials such as bismuth may provide a superior compromise for many applications. In any event, a voltage difference applied between input terminal 22 produces a potential gradient along region 13 parallel to the semiconductor junctions. This field is distorted in the presence of the magnetic field such that equal potential lines are no longer parallel to the surfaces 24 and 25 but make some angle $\theta$ with these surfaces. Current carriers injected or withdrawn from the ohmic contacts on surfaces 24 and 25 and therefore follow curved paths in region 13. They are diverted to the region 12 or region 14 depending on the type of current carriers, the polarity of the input voltage and the relative polarities of the various biases. A negative voltage at surface 24 will, for example, inject carriers into region 13 which follow curved paths to the region 12 while a negative voltage at surface 25 will inject carriers into region 13 which will be deflected to region 14. A positive voltage at surface 24, on the other hand, will withdraw carriers from region 14 while a positive voltage at surface 25 will withdraw carriers from region 12. Moreover, the number of carriers arriving at, or leaving, surfaces 24 and 25 will be related to the voltages appearing at the surfaces.

In accordance with normal transistor action, carriers injected into region 13 serve to provide an output at terminals 23 which is a representation of the current carrier movement but at a substantially increased power level. In this regard, central region 13 operates as the emitter region of two identical transistors, one of which comprises central region 10 as emitter, region 12 as base, and region 11 as collector. The other transistor includes region 13 as emitter, region 14 as base and region 15 as collector. In this sense the structure of FIG. 1 is a push-pull transistor amplifier having a common emitter electrode and separate base and collector electrodes. Across output terminals 23 there appears an amplified replica of the input voltage applied across input terminals 22. The structure of FIG. 1 therefore operates as a differential amplifier and is suitable for use for direct currents as well as for alternating currents up to frequencies at which the transistor action itself becomes impaired.

The differential amplifier of FIG. 1 includes semiconductor elements the properties of which are more or less dependent on ambient conditions such as temperature, humidity, etc. Because of the balanced configuration, however, variations in these properties are exactly cancelled out. That is, any variations in the properties of regions 11 and 12 which tend to increase the output voltage for a fixed input voltage are exactly balanced by a similar shift in the properties of regions 14 and 15 which tend to shift the output voltage in an opposite direction. This can be most easily seen by considering the input voltage applied to terminals 22 as zero. Under this condition, a small amount of leakage current will produce an output from region 11 which is sensitive to changes in temperature. A similar leakage current, however, will produce an output from region 15 which has the same magnitude and which varies in exactly the same way with temperature. The net voltage across output terminals 23 will therefore remain zero regardless of the changes in temperature. Since small variations due to ambient conditions are therefore cancelled out, the overall structure remains highly sensitive to extremely low level input signals, i.e., on the order of a few microvolts.

Due to its extreme sensitivity and high temperature stability, the structure of FIG. 1 is particularly suitable as an extremely low level voltage comparator. Furthermore, the structure of FIG. 1 is operative for direct current inputs as well as alternating current inputs and therefore provides a direct current voltage comparator at voltage levels heretofore difficult, if not impossible, to obtain. In a broader sense, the structural arrangement in FIG. 1 provides a Hall effect device in which the Hall effect output voltage is sufficiently enhanced to allow a zero transmission loss, or even a transmission gain, between input terminals 22 and output terminals 23. This property is particularly valuable because a large number of Hall effect devices heretofore proposed have met with limited practical applications due to the extremely high transmission losses normally incurred in these devices. In addition, the output impedance levels of the device of FIG. 1 may be readily controlled by choice of semiconductor materials and operating points. This flexibility of design overcomes another of the disadvantages of heretofore proposed Hall effect devices which normally provide output impedance levels so low that circuit requirements are difficult to meet.

Figure 2:
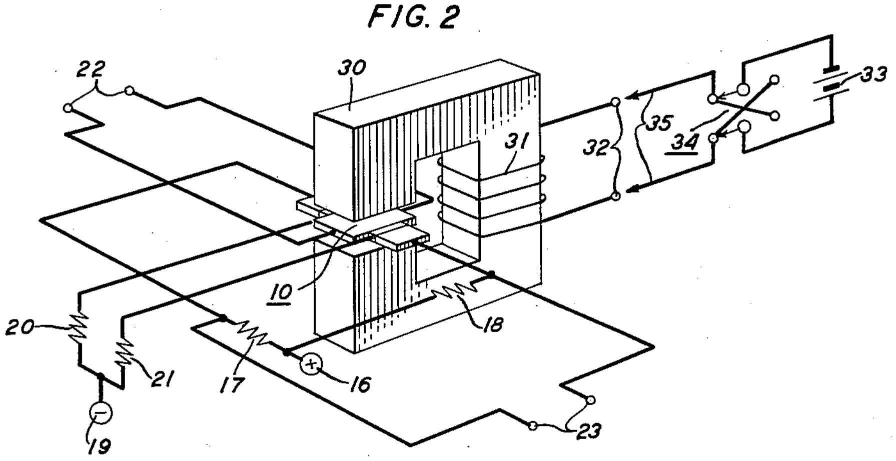
FIG. 2 is another perspective view of the device of FIG. 1 showing how this device may be used as a modulator.

In FIG. 2 there is shown one example of a Hall effect device in which these advantages of the present invention are utilized. In FIG. 2 a multi-region semiconductor element 10 such as that illustrated in FIG. 1 is shown between the poles of a magnetic structure 30. A coil 31 is wound about structure 30 and connected to external terminals 32. Since the Hall output voltage is proportional to the product of the input voltage and the magnetic field strength, the device of FIG. 2 may be readily utilized as a product modulator. A carrier signal may be injected at terminals 22 and a modulating signal at terminals 32. The output at terminals 23 will then be proportional to the instantaneous product of the carrier signal and the modulating signal.

This arrangement of FIG. 2 has the additional property of providing a phase reversal between terminals 22 and 23 when the magnetic field is reversed. A direct-current voltage source 33 may therefore be connected through reversing switch 34 and leads 35 to terminals 32. A reversal of switch 34 operates to shift the phase of signals transmitted between terminals 22 and 23 by 180 degrees. The structure of FIG. 2 therefore finds useful application as a time controlled phase splitter.

Figure 3:
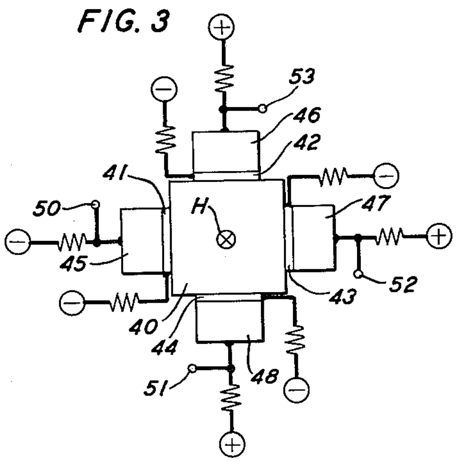
FIG. 3 illustrates a symmetrical Hall effect-transistor structure having nonreciprocal transmission properties.

In FIG. 3 there is shown yet another Hall effect device in which a central region 40 is provided with four rectilinear edges each forming a semiconductor junction between region 40 and adjacent ones of regions 41, 42, 43 and 44. Regions 41 through 44, in turn, are separated by similar junctions from adjacent regions 45, 46, 47 and 48. As in FIG. 1, regions 40, 45, 46, 47 and 48 are of the same conductivity type while regions 41 through 44 are of the opposite conductivity type. Region 40 is composed of a material which exhibits a substantial Hall effect while regions 41 through 48 are biased by voltages of proper polarity and magnitude to forward bias the junctions between central region 40 and adjacent regions 41 through 44 and to reverse bias the junctions between regions 41 through 44 and the adjacent ones of regions 45 through 48. Output terminals 50, 51, 52 and 53 are connected by ohmic contacts to regions 45, 46, 47 and 48, respectively. A magnetic field, represented conventionally by tail H of the magnetic field vector, is established in central region 40 in a direction perpendicular to the plane of the drawing.

The structure of FIG. 3 has the property that transmission in one direction between terminals 50 and 52 and terminals 51 and 53 incurs an 180 degree phase shift while transmission in the opposite direction between these terminals incurs no phase shift. A structure with these properties is conventionally termed a "gyrator" and has many useful applications. A structure having similar properties is disclosed in Patent 2,774,890, issued on December 18, 1956 to C. L. Semmelman. The structure of FIG. 3, however, has the additional properties of providing zero transmission loss or even a transmission gain between these terminal pairs and, furthermore, has easily controllable output and input impedance levels. Since the structure of FIG. 3 is entirely symmetrical, it is bilateral in nature and provides the same internal balancing of effects due to ambient conditions.

Figure 4:
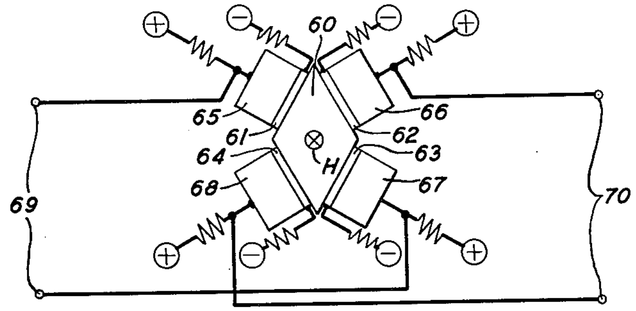
FIG. 4 shows an asymmetrical Hall effect-transistor structure also having nonreciprocal properties.

In FIG. 4 there is shown an asymmetrical device which is useful as a nonreciprocal transducer having different transmission characteristics in opposite directions. The element of FIG. 4 is similar to that of FIG. 3 in that a central region 60 has four adjacent regions 61, 62, 63 and 64 of opposite conductivity type on the four edges thereof. Connected to these four regions 61 through 64 are four more regions 65 through 68, each one of which is contiguous to a respective one of regions 61 through 64. A magnetic field represented by the vector H is established in central region 60. Means are provided to bias the junctions between the adjacent regions of opposite conductivity type such that the junctions closest to central region 60 are forward biased and the junctions furthest removed from junction 60 are reverse biased.

Central region 60 has the shape of an acute parallelogram, the acute angles of which have a predetermined magnitude. Magnetic field H is adjusted such that the angle of field distortion produced in central region 60 is exactly equal to this acute angle. Under this condition, an input signal at terminals 69 will establish an electrical field gradient across central region 60 which is distorted by the magnetic field H just sufficiently to place the corresponding portions of regions 62 and 64 at equi-potential points of region 60. No output will appear at output terminals 70 under this condition. In other words, the number of current carriers injected by region 61 into region 60 which arrive at region 62 is exactly equal to the number of current carriers injected by region 63 which reach region 64. The net voltage across the output terminal is therefore zero. An input voltage applied to terminal 70 will establish a similar potential gradient in central region 60 which is also distorted by the magnetic field. Since this distortion is in the same sense as previously and since the structure of FIG. 4 is not symmetrical, corresponding portions of regions 61 and 63 will not lie on equi-potential lines and a voltage will be produced at terminals 69. By proper adjustment of the semiconductor materials and the biasing voltages, the amplification through the device can be made to exactly equal the losses incurred in transmission through the device and the net transmission loss between terminals 70 and terminals 69 is zero. At the same time, an extremely large transmission loss will be incurred in transmitting from terminal 69 to terminal 70. The device of FIG. 4 therefore approximates quite closely the parameters of an ideal isolator.

Figure 5:
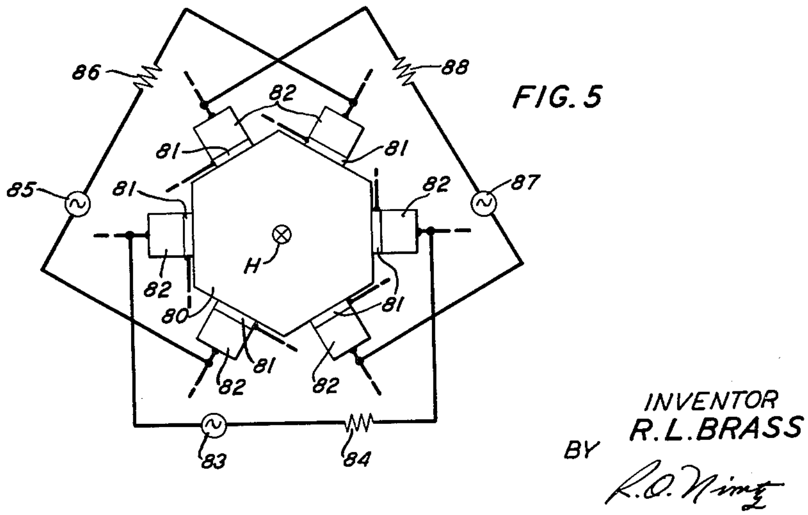
FIG. 5 is a simplified representation of a hexagonal Hall effect-transistor structure useful as a circulator.

In FIG. 5 there is shown yet another non-reciprocal structure in which a central region 80 has a hexagonal shape with six symmetrically disposed edge surfaces. At each of these edges a junction is formed with semiconductor material of opposite conductivity type which in turn forms a second junction with material of the same conductivity type as central region 80. In FIG. 5 each of the regions contiguous to central region 80 have been designated by the reference numeral 81 while each of the regions having the same conductivity type as central region 80 has been designated by the reference numeral 82. While the biasing arrangements have been omitted from FIG. 5 for the purposes of clarity, it is to be understood that the various regions of the structure of FIG. 5 are to be biased in a manner similar to that shown in FIGS. 3 and 4. A magnetic field H is induced in central region 80 as before.

A first signal source 83 and a first load 84 are connected in series between the free extremities of two diametrically opposed ones of regions 82. Similarly, a second signal source 85 and a second load 86 are connected in series between another pair of diametrically opposed ones of regions 82, and a signal source 87 and a load 88 are connected in series between the remaining ones of regions 82. The magnetic field H is adjusted to provide in a Hall angle exactly equal to the angle of displacement between adjacent ones of regions 82, i.e., 60 degrees.

The structure of FIG. 5 operates as follows: a signal originating at source 83 will establish an electric field in central region 80 such that the equal potential lines are distorted just sufficiently to place another pair of junction surfaces, for example, those connected to source 85 and load 86, on equal potential lines. There will therefore be no transmission from source 83 to the arm including source 85 and load 86. The junctions connected by source 87 and load 88, however, will not lie on equal potential lines and an output will be produced to be dissipated in load 88.

In a similar fashion, a signal originating at source 85 will not be transmitted to load 88 but only to load 84 and a signal originating at source 87 will not be transmitted to load 84 but only to load 86. The transmission paths described above define what is conventionally termed "a circulator." Such a device is useful in many applications, one of which is a transmit-receive system using a common antenna. The circulator of FIG. 5 would provide transmission from the transmitter to the antenna, and from the antenna to the receiver, and would block transmission from the antenna to the transmitter and from the receiver to the antenna. As in the devices described above, zero transmission loss through all of these transmission paths can be achieved by an appropriate choice of materials and bias potentials.

It is to be understood that the above-described arrangements are merely illustrative of the numerous and varied other arrangements representing applications of the principles of the present invention. It is possible, for example, to obtain the required asymmetry for the isolator of FIG. 4 with many other geometries. Similarly, the circulator of FIG. 5 can be made an n-port circulator simply by increasing the number of pairs of oppositely disposed semiconductor junctions. Many other modifications and extensions of the teachings herein presented will be readily apparent to those skilled in the art without departing from the spirit and scope of the present invention.

What is claimed is:

1. A semiconductor transducer comprising a central region of semiconductor material of one conductivity type, a first plurality of regions of the opposite conductivity type contiguous with said central region, a second equal plurality of regions of said one conductivity type each contiguous to a respective one region of said first plurality, means for forward biasing the junctions formed between said central region and each of said regions of said first plurality, means for reverse biasing the junctions between each of said regions of said first plurality and each of said regions of said second plurality, and means for establishing a magnetic field in said central region.

2. The semiconductor transducer according to claim 1 further including means for varying said magnetic field.

3. In combination, a semiconductor body comprising at least five regions adjacent ones of which are of opposite conductivity types, means for establishing a magnetic field in one of said regions, means for establishing an electric field in said one region at right angles to said magnetic field, means for forward biasing the junctions between said one region and the adjacent regions, and means for reverse biasing the remaining junctions.

4. A multi-terminal semiconductor device comprising a semiconductor body, a centrally disposed region of said body comprising semiconductor material of one conductivity type and exhibiting a substantial Hall effect, a first plurality of regions adjacent to said central region comprising semiconductor material of the opposite conductivity type and forming first semiconductor rectifying junctions with said central region, a second plurality of regions of semiconductor material of said one conductivity type, each of which is adjacent to one of said first plurality of regions to form second semiconductor rectifying junctions, means for biasing said first and second semiconductor junctions in opposite senses with respect to their directions of low impedance, and means for establishing a magnetic field in said central region parallel to said semiconductor junctions.

5. The multi-terminal semiconductor device according to claim 4 in which said first and second plurality are each equal to two, and means for establishing an electric field in said central region perpendicular to said magnetic field.

6. The multi-terminal semiconductor device according to claim 5 further including means for modulating said magnetic field with an intelligence signal and means for modulating said electric field with a carrier signal.

7. The multi-terminal semiconductor device according to claim 5 further including means for reversing the direction of said magnetic field.

8. The multi-terminal semiconductor device according to claim 4 wherein said first and second plurality are each equal to four arranged in alternate pairs, means for impressing an input signal across one of said pairs, and means for deriving an output signal across the other of said pairs.

9. The multi-terminal semiconductor device according to claim 8 wherein said central region is rectangular.

10. The multi-terminal semiconductor device according to claim 8 wherein said central region is an acute parallelogram.

11. The multi-terminal semiconductor device according to claim 4 wherein said first and second plurality are each equal to *n*, where *n* is an even number of regions arranged in oppositely disposed pairs, and signal utilizing means and a source of signals connected in series between each of said pairs.

12. The multi-terminal semiconductor device according to claim 11 wherein *n* is equal to six.

13. A semiconductor differential amplifier comprising a semiconductor body including five laterally disposed semiconductor regions adjacent ones of which are of opposite conductivity types to form semiconductor junctions between said adjacent regions, means for establishing a magnetic field in the central one of said regions, means for forward biasing two central ones of said junctions and for reverse biasing two outside ones of said junctions, means for applying an input voltage to said central region to establish a potential gradient therein parallel to said semiconductor junctions, means for establishing a magnetic field in said central region perpendicular to said potential gradient, and means for deriving an output signal between the outermost two of said regions.

14. A gyrator comprising a semiconductor body including a centrally disposed region of semiconductor material of one conductivity type, four symmetrically disposed regions of opposite conductivity types forming first rectifying junctions with said centrally disposed region, four additional regions of said one conductivity type each forming a rectifying junction with one of said symmetrically disposed regions parallel to one of said first rectifying junctions, means for biasing each of said rectifying junctions, means for establishing a magnetic field in said central region perpendicular to said junctions, and means for connecting signal transducer means across each alternate pair of said four additional regions.

15. An isolator comprising a semiconductor body having a centrally disposed asymmetrical region of semiconductor material of a first conductivity type, a first four regions adjacent to said central region and of semiconductor material of opposite conductivity type, said adjacent regions being disposed such that lines drawn between the centers of alternate ones of said adjacent regions intersect within said central region to form a given acute angle, four additional regions of semiconductor material of said first conductivity type, each of said additional four regions being adjacent to one of said first four regions, means for establishing a magnetic field in said central region of sufficient intensity to cause a Hall effect distortion of electric fields in said central region having a Hall angle equal to said given acute angle, and terminal means connected to each of said additional four regions.

16. A circulator comprising a semiconductor body having a centrally disposed region of semiconductor material of one conductivity type, at least three oppositely disposed pairs of regions of semiconductor material of opposite conductivity type each of which forms a semiconductor rectifying junction with said central region, an exterior region of semiconductor material of said one conductivity type adjacent to each region of said oppositely disposed pairs, means for biasing each of said semiconductor regions, means for establishing a magnetic field in said central region, and input-output means connected between each oppositely disposed pair of said exterior regions.

References Cited in the file of this patent

UNITED STATES PATENTS

| | | |
|---|---|---|
| 2,695,930 | Wallace | Nov. 30, 1954 |
| 2,774,890 | Semmelman | Dec. 18, 1956 |
| 2,862,184 | Longini | Nov. 25, 1958 |
| 2,877,309 | Henisch | Mar. 10, 1959 |
| 2,944,165 | Stuetzer | July 5, 1960 |